United States Patent
Tseng et al.

(10) Patent No.: US 9,667,308 B2
(45) Date of Patent: May 30, 2017

(54) METHOD AND APPARATUS FOR GENERATING A SPREAD-SPECTRUM CLOCK

(71) Applicant: REALTEK SEMICONDUCTOR CORP., Hsinchu (TW)

(72) Inventors: Shun-Te Tseng, Hsinchu (TW); Chi-Shun Weng, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/980,980

(22) Filed: Dec. 28, 2015

(65) Prior Publication Data

US 2016/0204766 A1    Jul. 14, 2016

(30) Foreign Application Priority Data

Jan. 9, 2015   (TW) .............................. 104100770 A

(51) Int. Cl.
*H04B 1/69*    (2011.01)
*H03K 3/84*    (2006.01)

(52) U.S. Cl.
CPC ................. *H04B 1/69* (2013.01); *H03K 3/84* (2013.01)

(58) Field of Classification Search
CPC ...... H03K 5/133; H03K 5/135; H03K 5/1565; H03K 5/13; H03K 5/14; H03K 3/012
USPC .................................. 327/113, 115, 116, 117
See application file for complete search history.

(56) References Cited

U.S. PATENT DOCUMENTS

| | | | |
|---|---|---|---|
| 2008/0094113 A1 * | 4/2008 | Kuan ................... | H03K 5/1506 327/117 |
| 2008/0231331 A1 | 9/2008 | Balraj et al. | |
| 2009/0083567 A1 | 3/2009 | Kim et al. | |
| 2010/0229019 A1 | 9/2010 | Huang et al. | |

* cited by examiner

*Primary Examiner* — John Poos
(74) *Attorney, Agent, or Firm* — WPAT, PC; Justin King

(57) ABSTRACT

This disclosure provides an apparatus for generating a spread-spectrum clock, which comprises: a multi-phase clock generator generating a pre-determined number of first clock signals having substantially identical period and different phases; a spread spectrum clock controller producing an instruction signal according to a first pre-determined spread spectrum target; and a clock selector receiving the instruction signal and dynamically selecting a clock signal from the first clock signals according to the instruction signal so as to produce a first spread spectrum signal; wherein the first spread spectrum signal has a spread spectrum corresponding to the first pre-determined spread spectrum target.

15 Claims, 4 Drawing Sheets

METHOD AND APPARATUS FOR GENERATING A SPREAD-SPECTRUM CLOCK

CROSS-REFERENCE TO RELATED APPLICATION

This application claims the benefit of Taiwan Patent Application No. 104100770, filed on Jan. 9, 2015, in Taiwan Intellectual Property Office, the disclosure of which is incorporated herein in its entirety by reference.

BACKGROUND OF THE INVENTION

1. Field of the Invention

The present invention generally relates to a method and an apparatus for generate a spread-spectrum clock, in particular to an electronic device using a spread-spectrum clock.

2. Description of the Related Art

Clock circuit is one of the important components for most electronic devices, which will influence their overall system performance. However, the clock signal will generate strong electromagnetic interference (EMI) on its frequency. Thus, in the industry, a threshold value will be defined as the upper limit of the electromagnetic interference generated by the clock signal. The current technology usually uses the spread-spectrum clock to dynamically change the frequency of the clock signal to distribute the energy of the clock signal in order to conform to the EMI requirement.

The conventional spread spectrum controller is composed of a phase locked loop with a loop filter, which is a closed-loop type circuit structure. When the spread spectrum controller is provided to control the phase locked loop to execute the spread spectrum process for the clock signal, it is not easy to know the timing for each spread spectrum command starting to affect the phase locked loop. Besides, it is also not easy to make sure how much clock phase offset will be generated for each spread spectrum command. However, the above information is relatively important for a circuit system with constant throughput. Accordingly, it is necessary to develop a new spread spectrum clock generating technology to solve the problems.

SUMMARY OF THE INVENTION

To achieve the foregoing objective, according to one aspect of the present invention, one embodiment of the present invention provides a method for generating a spread-spectrum clock; the method includes the following steps: providing a pre-determined number (M) of first clock signals, wherein the first clock signals have substantially identical period (T) and different phases; producing an instruction signal according to a first pre-determined spread spectrum target; dynamically selecting one of the first clock signals according to the instruction signal so as to produce a first spread spectrum signal; wherein the spectrum of the first spread spectrum signal is corresponding to the first pre-determined spread spectrum target.

According to another aspect of the present invention, another embodiment of the present invention provides an apparatus using a spread-spectrum clock; the apparatus includes a multi-phase clock generator, a spread spectrum clock controller, and a clock selector. The multi-phase clock generator generates a pre-determined number of first clock signals, wherein the first clock signals have substantially identical period (T) and different phases; the spread spectrum clock controller produces an instruction signal according to a pre-determined spread spectrum target; the clock selector receives the instruction signal and dynamically selecting one of the first clock signals according to the instruction signal so as to produce a first spread spectrum signal, wherein the spectrum of the first spread spectrum signal is corresponding to the first pre-determined spread spectrum target.

According to another aspect of the present invention, another embodiment of the present invention provides an apparatus using a spread-spectrum clock; the apparatus includes a multi-phase clock generator, a spread spectrum clock controller, a first clock selector and a second clock selector. The multi-phase clock generator generates a pre-determined number (M) of first clock signals, wherein the first clock signals have substantially identical period (T) and different phases; the spread spectrum clock controller respectively produces a first instruction signal and a second instruction signal according to a first pre-determined spread spectrum target and a second pre-determined spread spectrum target; the first clock selector receives the first instruction signal and dynamically selects one of the first clock signals according to the first instruction signal so as to produce a first spread spectrum signal; the second clock selector receives the second instruction signal and dynamically selects one of the first clock signals according to the second instruction signal so as to produce a second spread spectrum signal, wherein the spectrum of the first spread spectrum signal is corresponding to the first pre-determined spread spectrum target, and the spectrum of the second spread spectrum signal is corresponding to the second pre-determined spread spectrum target.

In a preferred embodiment of the present invention, when the first clock signals are numbered from 1 to M, the phase difference between the first clock signal numbered n and the first clock signal numbered 1 is $(n-1) \times T/M$.

In a preferred embodiment of the present invention, the first clock selector randomly selects one of the first clock signals, or selects the first clock signals numbered from 1 to M in ascending order, and then selects the first clock signals numbered from M to 1 in descending order.

In a preferred embodiment of the present invention, the second clock selector randomly selects one of the first clock signals, or selects the first clock signals numbered from 1 to M in ascending order, and then selects the first clock signals numbered from M to 1 in descending order.

In a preferred embodiment of the present invention, the apparatus further includes a first-in first-out buffer, wherein the first spread spectrum signal and the second spread spectrum signal respectively serve as a write clock and a read clock of the first-in first-out buffer.

In a preferred embodiment of the present invention, the apparatus further includes a phase difference calculator, wherein the phase difference calculator accumulates phase differences between the first spread spectrum signal and the first clock signals, and accumulates phase differences between the second spread spectrum signal and the first clock signals.

BRIEF DESCRIPTION OF THE DRAWINGS

The detailed structure, operating principle and effects of the present invention will now be described in more details hereinafter with reference to the accompanying drawings that show various embodiments of the invention as follows.

DETAILED DESCRIPTION OF THE PREFERRED EMBODIMENTS

Figure 1:
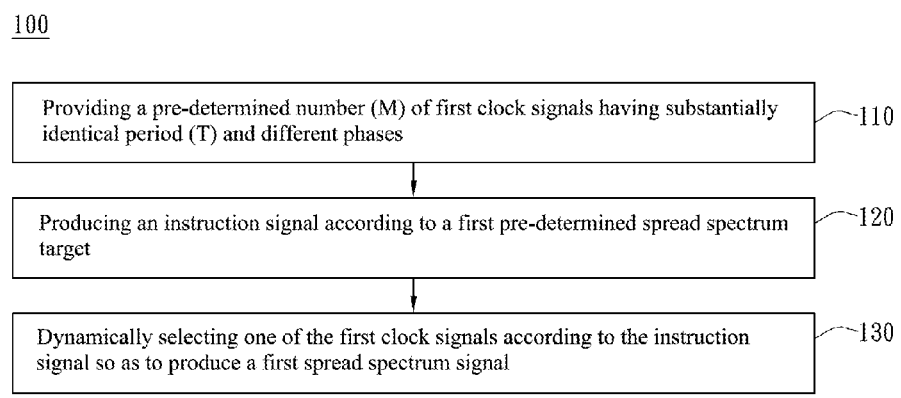
FIG. 1 is the flow chart of the first embodiment of the method for generating a spread-spectrum clock in accordance with the present invention.

For your esteemed members of reviewing committee to further understand and recognize the fulfilled characteristics, objects and functions of the invention, several exemplary embodiments cooperating with detailed description and drawings are presented as the follows. In all drawings and the description of the specification, the identical or similar elements are attached with the same element numbers. In the description of all embodiments, the terms "first", "second" and "third" are used to describe different elements, but these elements are not limited to these terms. For the purpose of conveniently and clearly describe the embodiments of the invention, the size of each element in the drawings may be shown exaggeratedly, omittedly or roughly; besides, the size of each element in the drawings may be not its real size.

FIG. 1 is the flow chart of the first embodiment of the method for generating a spread-spectrum clock in accordance with the present invention, which includes the following steps: (Step 110) providing a plurality of first clock signals, wherein these first clock signals have substantially identical period (T) and different phases; (Step 120) producing an instruction signal according to a first pre-determined spread spectrum target; and (Step 130) dynamically selecting one of the first clock signals according to the instruction signal so as to produce a first spread spectrum signal, wherein the spectrum of the first spread spectrum signal is corresponding to the first pre-determined spread spectrum target. The method 100 selects one of the clock signals with the same frequency and different phases (as the aforementioned first clock signals) by the instruction signal in order to execute the spread spectrum process for the selected first clock signal (then the aforementioned first spread spectrum signal is obtained); next, as the method 100 already knows, before the instruction signal is generated, the phase offset of the clock signal before and after the spread spectrum process so as to further obtain the spread spectrum effect taking place on the clock signal due to the applied instruction signal; thus, we can design a serial instruction signal according to the aforementioned phase offset; for the reason, the method 100 is particularly suitable for a circuit system with constant throughput.

Figure 2:
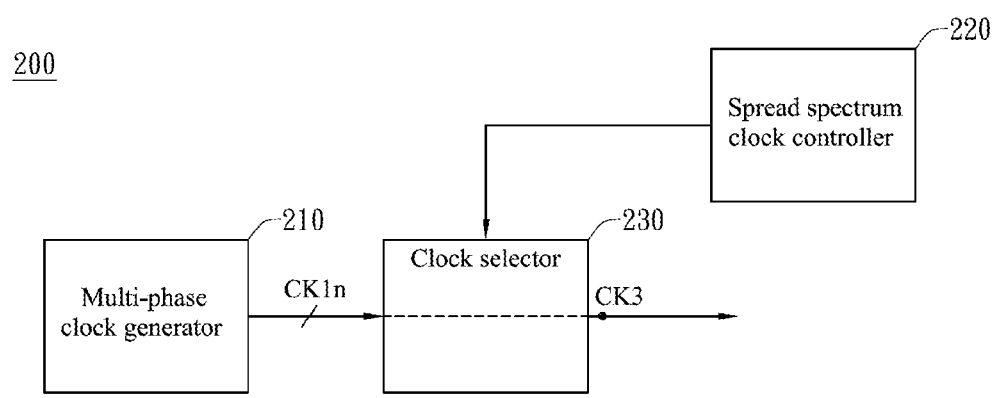
FIG. 2 is the block diagram of the first embodiment of the apparatus for generating a spread-spectrum clock in accordance with the present invention.

Two embodiments, as follows, are provided according to the aforementioned method 100 so as to implement the present invention by circuit design. FIG. 2 is the block diagram of the first embodiment of the apparatus 200 for generating a spread-spectrum clock in accordance with the present invention; the apparatus 200 for generating a spread-spectrum clock includes a multi-phase clock generator 210, a spread spectrum clock controller 220 and a clock selector 230. The multi-phase clock generator 210 can generate a plurality of first clock signals $CK1_n$, which will be provided for the clock selector 230 as the candidate clocks. The clock selector 230 can select an appropriate clock from these candidate clocks to execute the spread spectrum process according to a first pre-determined spread spectrum target, producing the spread spectrum clocks that the apparatus 200 desires, wherein the first clock signals $CK1_n$ have substantially identical period (T) and different phases. In the following description of the specification, T stands for the period of the first clock signals $CK1_n$; M stands for the quantity of the first clock signals $CK1_n$; n stands for the index numbers of the first clock signals $CK1_n$; in other words, the first clock signals $CK1_n$ can be numbered from $CK1_1$ to $CK1_M$. In the embodiment, when the first clock signals $CK1_n$ are orderly numbered from $CK1_1$ to $CK1_M$, the phase difference between the first clock signal $CK1_n$ and the first clock signal $CK1_1$ is $(n-1) \times T/M$; that is to say, the phase difference between the adjacent first clock signals is T/M. Take the quantity M=4 as an example, the phase difference between the adjacent first clock signals (for instance, $CK1_1$ and $CK1_2$, $CK1_2$ and $CK1_3$, $CK1_3$ and $CK1_4$) is T/4, as shown in FIG. 3.

The spread spectrum clock controller 220 can generate an instruction signal according to the first pre-determined spread spectrum target for the clock selector 230; the instruction signal can control and instruct the clock selector 230 to select appropriate one of the first clock signals in order to execute the spread spectrum process. After receiving the instruction signal, the clock selector 230 will dynamically select one of the first clock signals (i.e. the desired clock signal for the spread spectrum process) and then output the selected first clock signal; then, the clock selector 230 will execute the spread spectrum process for the selected first clock signal according to the instruction signal so as to generate a first spread spectrum clock signal CK3 (i.e. the clock signal after the spread spectrum process).

In addition, the apparatus 200 for generating a spread-spectrum clock of the embodiment of the present invention may further include a phase difference calculator (not shown in the drawings), which can accumulate the phase difference between the first spread spectrum signal and the selected first clock signal. Since the phases of the first clock signals $CK1_n$ generated by the multi-phase clock generator 210 are known information, the spread spectrum clock controller 220 can learn or calculate the phase difference between the first spread spectrum signal CK3 and the selected first clock signal (which are just the phase difference between the selected first clock signal before and after the spread spectrum process); afterward, the spread spectrum clock controller 220 will generate the instruction signal for next round accordingly in order to control or instruct the clock selector 230. Besides, if the instruction signal includes a serial instruction, the spread spectrum clock controller 220 will also accumulate the phase differences between the first spread spectrum signal CK3 and the selected first clock signal at different time points; then, the result of which will also serve as the basis for the spread spectrum clock controller 220 to generate the instruction signal for next round for the purpose of fulfilling the requirement by apparatus 200 of not exceeding a maximum accumulated phase difference.

Figure 3:
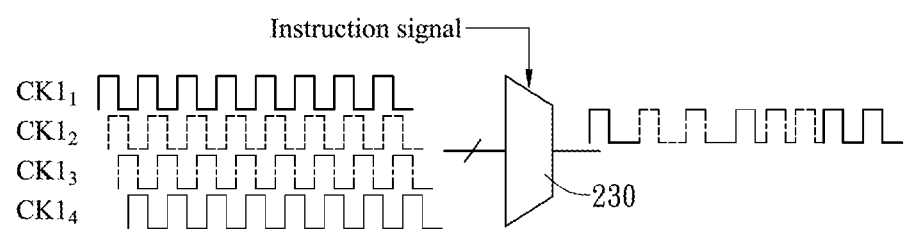
FIG. 3 is the block diagram of the clock selector of the first embodiment.

FIG. 3 is the block diagram of the clock selector 230 of the first embodiment, which illustrates the example where the quantity M of the first clock signals $CK1_n$ is 4. The first clock signals, $CK1_1$, $CK1_2$, $CK1_3$, $CK1_4$, provided by the multi-phase clock generator 210 are to the left-hand side of the clock selector 230, and the phase difference between the adjacent first clock signals ($CK1_1$ and $CK1_2$, $CK1_2$ and $CK1_3$, $CK1_3$ and $CK1_4$) is T/4. In one embodiment, the clock selector 230 can randomly selects one of the first clock signals, $CK1_1$, $CK1_2$, $CK1_3$, $CK1_4$, to execute the spread spectrum process. In another embodiment, the clock selector 230 can select the first clock signals in ascending order "1~M", and then select the first clock signals in descending order "M–1". As shown in FIG. 3, the first clock signals to the right-hand side of the clock selector 230 are selected by the order "$CK1_1$, $CK1_2$, $CK1_3$, $CK1_4$, $CK1_4$, $CK1_3$, $CK1_2$, $CK1_1$" so as to execute the spread spectrum process. However, the present invention does not limit the length of the functional period, during which one of the first clock signals is selected; in other words, the lengths of the functional periods of the first clock signals $CK1_1$, $CK1_2$, $CK1_3$, $CK1_4$ being selected may be different from or the same with each other. The clock selector 230 includes the function of the high-speed multiplexer, which can properly select and switch the first clock signals $CK1_1$, $CK1_2$, $CK1_3$, $CK1_4$.

According to the method 100 and the apparatus 200 for generating a spread spectrum clock, if an electronic device using the spread spectrum clocks needs two or more independent spread spectrum clocks, the present invention only needs to provide the clock selectors as many as the spread spectrum clocks for the electronic device; on the contrary, the apparatus of the prior art should provide the multi-phase clock generators as many as the spread spectrum clocks for the electronic device; therefore, the present invention can significantly reduce the cost. For example, for a circuit system with constant throughput, its transmitter's and receiver's (or reader's and writer's) clocks for transmitting or receiving data may be slightly different in frequency; or the two clocks have the same frequency but different phases; accordingly, the interface area of the system usually needs a first-in first-out buffer (FIFO) to adjust or flexibly control the data flow between the transmitter and receiver (or reader and writer). On the contrary, according to the present invention, the clock signals of the transmitter and receiver (or reader and writer) can be generated by two independent clock selectors with independent spread spectrum control instruction sequences; moreover, since the phase difference between the two clocks can be anticipated, the depth of the first-in first-out buffer can be determined early in circuit design stage to achieve the system with constant throughput, preventing the phase difference between the two clocks from accumulating to make the FIFO buffer overflow.

Figure 4:
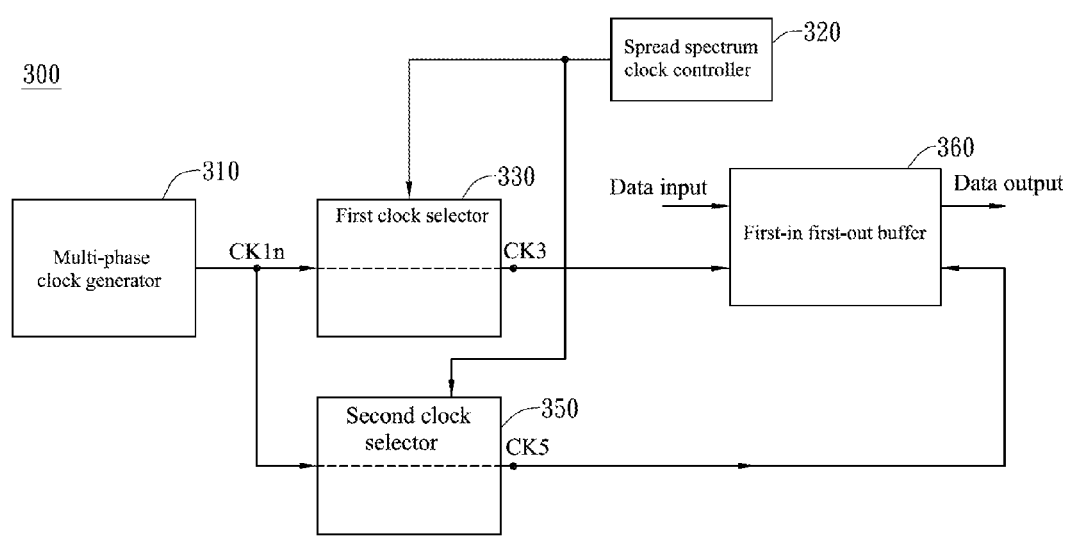
FIG. 4 is the block diagram of the second embodiment of the apparatus using two spread-spectrum clocks in accordance with the present invention.

FIG. 4 is the block diagram of the second embodiment of the apparatus 300 using two spread-spectrum clocks in accordance with the present invention; the apparatus 300 includes a multi-phase clock generator 310, a spread spectrum clock controller 320 and a first clock selector 330, a second clock selector 350 and a first-in first-out buffer 360. The multi-phase clock generator 310 is equal to the multi-phase clock generator 210 of the first embodiment, which can generate a plurality of first clock signals $CK1_n$ provided for the first clock selector 330 and the second clock selector 350 as the candidate clocks. Afterward, the first clock selector 330 and the second clock selector 350 can select the appropriate clocks from these candidate clocks to execute the spread spectrum process according to a first pre-determined spread spectrum target and a second pre-determined spread spectrum target, producing the spread spectrum clocks that the apparatus 300 desires, wherein the first clock signals $CK1_n$ have substantially identical period (T) and different phases. It is noted that those data or parameters corresponding to the first pre-determined spread spectrum target and the second pre-determined spread spectrum target can be stored in a memory or registers, In the embodiment, the first clock signals $CK1_n$ are orderly numbered from $CK1_1$ to $CK1_M$, and the phase difference between the first clock signal $CK1_n$ and the first clock signal $CK1_1$ is (n–1)× T/M; that is to say, the phase difference between the adjacent first clock signals is T/M.

The spread spectrum clock controller 320 is equal to the spread spectrum clock controller 220 of the first embodiment, which can produce an first instruction signal according to the first pre-determined spread spectrum target, and produce an second instruction signal according to the second pre-determined spread spectrum target; the first instruction signal and the second instruction signal can control or instruct the first clock selector 330 and the second clock selector 350 to respectively select the appropriate clocks from the first clock signals $CK1_n$ in order to execute the spread spectrum process. After receiving the first instruction signal, the first clock selector 330 will dynamically select one of the first clock signals $CK1_n$ (i.e. the desired clock signal for the spread spectrum process); then, the first clock selector 330 will execute the spread spectrum process for the selected first clock signal according to the first instruction signal so as to generate a first spread spectrum clock signal CK3 (i.e. the clock signal after the spread spectrum process). After receiving the second instruction signal, the second clock selector 350 will dynamically select one of the first clock signals $CK1_n$ (i.e. the desired clock signal for the spread spectrum process); then, the first clock selector 330 will execute the spread spectrum process for the selected first clock signal according to the second instruction signal so as to generate a second spread spectrum clock signal CK5 (i.e. the clock signal after the spread spectrum process).

In addition, the apparatus 300 for generating a spread-spectrum clock may further include a phase difference calculator (not shown in the drawings), which can accumulate phase difference between the first spread spectrum signal and the selected first clock signal according to the first instruction signal, and accumulate phase difference between the second spread spectrum signal and the selected first clock signal. Since the phases of the first clock signals $CK1_n$ generated by the multi-phase clock generator 310 are known information, the spread spectrum clock controller 320 can not only learn or calculate the first phase difference between the first spread spectrum signal CK3 and the selected first clock signal, but also can learn or calculate the second phase difference between the second spread spectrum signal CK5 and the other selected first clock signal (which are just the phase difference between the selected first clock signal before and after the spread spectrum process) before the instruction signal is generated; afterward, the spread spectrum clock controller 320 will generate the first instruction signal and the second instruction signal for next round accordingly in order to respectively control or instruct the first clock selector 330 and the second clock selector 350. Besides, if the instruction signal includes a serial instruction, the spread spectrum clock controller 320 can not only accumulate the first phase difference between the first spread spectrum signal CK3 and the selected first clock signal, but also can accumulate the second phase differences between the second spread spectrum signal CK5 and the other selected first clock signal at different time points; then, the result of which will also serve as the basis for the spread spectrum clock controller 320 to generate the first instruction signal and the second instruction signal for next round for the purpose of fulfilling the requirement by the apparatus 300 of not exceeding a maximum accumulated phase difference.

When the accumulation of the differences of the first phase difference and the second phase difference reaches a pre-determined value, the spread spectrum clock controller 320 will generate next first instruction signal and next second instruction signal for the apparatus to achieve the best operation. The first clock selector 330 and the second clock selector 350 can respectively randomly select one of the first clock signals $CK1_n$ so as to execute the spread spectrum process. In another embodiment, the first clock selector 330 and the second clock selector 350 can select the first clock signals $CK1_1 \sim CK1_M$ in ascending order "1~M", and then select the first clock signals $CK1_M \sim CK1_1$ in descending order "M~1".

As described above, the first-in first-out buffer 360 is the necessary interface area to achieve the system with constant throughput, which can regulate the data flow between the reader and the writer. In the embodiment, the first spread spectrum signal CK3 and the second spread spectrum signal CK5 respectively act as the write clock and the read clock of the first-in first-out buffer 360. The phase difference between the first spread spectrum signal CK3 and the second spread spectrum signal CK5 will keep accumulating; thus, if the accumulated phase difference between the two clock signals cannot be accurately calculated and then properly adjust the first spread spectrum signal CK3 and the second spread spectrum signal CK5 respectively to prevent the accumulated phase difference from exceeding the depth of the first-in first-out buffer 360, the first-in first-out buffer 360 will finally overflow due to insufficient internal memory space. The phase differences of the first spread spectrum signal CK3 and the second spread spectrum signal CK5 at different time points will also be accumulated, when the phase different accumulation reaches a pre-determine value, the spread spectrum clock controller 320 will take proper action to optimize the operation of the apparatus 300; for instance, the spread spectrum clock controller 320 can generate next set of the first and second instruction signals so that the phase difference generated by the first clock selector 330 and the second clock selector 350 decrements.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. A method for generating a spread-spectrum clock, comprising:
   providing a pre-determined number (M) of first clock signals having substantially identical period (T) and different phases; and
   producing an instruction signal according to a first pre-determined spread spectrum target; and
   dynamically selecting one of the first clock signals according to the instruction signal so as to produce a first spread spectrum signal;
   wherein a spectrum of the first spread spectrum signal is corresponding to the first pre-determined spread spectrum target.

2. The method of claim 1, wherein when the first clock signals are numbered from 1 to M, a phase difference between the first clock signal numbered n and the first clock signal numbered 1 is $(n-1) \times T/M$.

3. The method of claim 2, wherein the step of dynamically selecting one of the first clock signals is to randomly select one of the first clock signals.

4. The method of claim 2, wherein the step of dynamically selecting one of the first clock signals is to select the first clock signals numbered from 1 to M in ascending order, and then select the first clock signals numbered from M to 1 in descending order.

5. An apparatus for generating a spread-spectrum clock, comprising:
   a multi-phase clock generator, configured to generate a pre-determined number (M) of first clock signals having substantially identical period (T) and different phases;
   a spread spectrum clock controller, configured to produce an instruction signal according to a first pre-determined spread spectrum target; and
   a clock selector, configured to receive the instruction signal and dynamically selecting one of the first clock signals according to the instruction signal so as to produce a first spread spectrum signal;
   wherein a spectrum of the first spread spectrum signal is corresponding to the first pre-determined spread spectrum target.

6. The apparatus of claim 5, wherein when the first clock signals are numbered from 1 to M, a phase difference between the first clock signal numbered n and the first clock signal numbered 1 is $(n-1) \times T/M$.

7. The apparatus of claim 6, wherein the clock selector randomly selects one of the first clock signals.

8. The apparatus of claim 6, wherein the clock selector selects the first clock signals numbered from 1 to M in ascending order, and then selects the first clock signals numbered from M to 1 in descending order.

9. The apparatus of claim 6, further comprising a phase difference calculator, wherein the phase difference calculator accumulates phase differences between the first spread spectrum signal and the first clock signals selected and outputted according to the instruction signal.

10. An apparatus using a spread-spectrum clock, comprising:
    a multi-phase clock generator, configured to generate a pre-determined number (M) of first clock signals having substantially identical period (T) and different phases;
    a spread spectrum clock controller, configured to respectively produce a first instruction signal and a second instruction signal according to a first pre-determined spread spectrum target and a second pre-determined spread spectrum target;
    a first clock selector, configured to receive the first instruction signal and dynamically selecting one of the first clock signals according to the first instruction signal so as to produce a first spread spectrum signal;
    a second clock selector, configured to receive the second instruction signal and dynamically selecting one of the first clock signals according to the second instruction signal so as to produce a second spread spectrum signal;
    wherein a spectrum of the first spread spectrum signal is corresponding to the first pre-determined spread spectrum target, and a spectrum of the second spread spectrum signal is corresponding to the second pre-determined spread spectrum target.

11. The apparatus of claim 10, wherein when the first clock signals are numbered from 1 to M, a phase difference between the first clock signal numbered n and the first clock signal numbered 1 is $(n-1) \times T/M$.

12. The apparatus of claim 11, wherein the first clock selector randomly selects one of the first clock signals, or selects the first clock signals numbered from 1 to M in ascending order, and then selects the first clock signals numbered from M to 1 in descending order.

13. The apparatus of claim 11, wherein the second clock selector randomly selects one of the first clock signals, or selects the first clock signals numbered from 1 to M in ascending order, and then selects the first clock signals numbered from M to 1 in descending order.

14. The apparatus of claim 11, further comprising a first-in first-out buffer, wherein the first spread spectrum signal and the second spread spectrum signal respectively serve as a write clock and a read clock of the first-in first-out buffer.

15. The apparatus of claim 10, further comprising a phase difference calculator, wherein the phase difference calculator accumulates phase differences between the first spread spectrum signal and the first clock signals, and accumulates phase differences between the second spread spectrum signal and the first clock signals.

* * * * *